(12) United States Patent
Kuo

(10) Patent No.: US 9,893,729 B2
(45) Date of Patent: Feb. 13, 2018

(54) LEVEL SHIFTER OF DRIVING CIRCUIT

(71) Applicant: Raydium Semiconductor Corporation, Hsinchu (TW)

(72) Inventor: Chia-Ming Kuo, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 270 days.

(21) Appl. No.: 14/933,900

(22) Filed: Nov. 5, 2015

(65) Prior Publication Data
US 2016/0142056 A1   May 19, 2016

(30) Foreign Application Priority Data

Nov. 14, 2014 (TW) .............................. 103139631 A

(51) Int. Cl.
*H03F 3/00* (2006.01)
*H03K 19/0185* (2006.01)
*G09G 3/20* (2006.01)
*G09G 3/3266* (2016.01)
*G09G 3/36* (2006.01)

(52) U.S. Cl.
CPC ....... *H03K 19/018521* (2013.01); *G09G 3/20* (2013.01); *G09G 3/3266* (2013.01); *G09G 3/3677* (2013.01); *G09G 2310/0243* (2013.01); *G09G 2310/0286* (2013.01)

(58) Field of Classification Search
CPC ............. H03K 17/693; H03K 19/0002; H03K 19/017581; H03K 19/17752; H03K 19/1776; H03K 21/02; H03K 2217/0045; H03K 3/012; H03K 3/017; H03K 3/02337; H03K 3/037; H03K 3/356; H03K 5/24; H03K 19/018521; H03F 2200/03; G09G 5/006; G09G 2310/0289; G09G 2310/08; G09G 3/20; G09G 3/36773; G09G 3/3266; G09G 2310/0243; G09G 2310/0286
See application file for complete search history.

(56) References Cited

U.S. PATENT DOCUMENTS

| | | | | |
|---|---|---|---|---|
| 8,283,964 B2* | 10/2012 | Cassia | ................ | H03K 3/35613 326/61 |
| 9,755,621 B1* | 9/2017 | Sinha | ............... | H03K 3/356113 |
| 2010/0109705 A1* | 5/2010 | Pamperin | ......... | H03K 3/356113 326/68 |
| 2015/0097612 A1* | 4/2015 | Chuang | ............ | H03K 3/356182 327/333 |
| 2015/0102849 A1* | 4/2015 | Si | ....................... | H03K 19/0175 327/333 |

* cited by examiner

*Primary Examiner* — Temesghen Ghebretinsae
*Assistant Examiner* — Paras D Karki

(57) ABSTRACT

A level shifter applied to a driving circuit of a display is disclosed. The level shifter at least includes a first stage of level shifting unit, a second stage of level shifting unit, and two third stage of level shifting units belonging to different power domains and used to perform boost conversion of voltage signals in different power domains. The first stage of level shifting unit includes eight transistors. The second stage of level shifting unit includes four transistors. The two third stage of level shifting units both include six transistors and two output terminals. The level shifter of the driving circuit in this invention makes the output terminals of the two third stage of level shifting units belonging to different power domains to synchronously output the voltage-shifted voltage signals.

10 Claims, 5 Drawing Sheets

LEVEL SHIFTER OF DRIVING CIRCUIT

BACKGROUND OF THE INVENTION

Field of the Invention

This invention relates to a driving circuit of a display, especially to a level shifter applied to a driving circuit of a display.

Description of the Related Art

In general, the driving circuit of the display performs multi-power domain boost on input voltage signals through level shifters. Please refer to FIG. 1 and FIG. 2. FIG. 1 illustrates a schematic diagram of the level shifter of the conventional driving circuit; FIG. 2 illustrates a detailed circuit diagram of the level shifter of FIG. 1.

As shown in FIG. 1, the conventional level shifter 7 can include a first stage of level shifting unit 71 and two second stage of level shifting units 72 and 73. The first stage of level shifting unit 71 is coupled between the ground voltage AGND/half-operating voltage hAVDD and the first middle voltage VCL1; the second stage of level shifting unit 72 is coupled between the half-operating voltage hAVDD and the operating voltage AVDD; the second stage of level shifting unit 73 is coupled between the ground voltage AGND and the half-operating voltage hAVDD; the first stage of level shifting unit 71 is coupled to the second stage of level shifting unit 72.

As shown in FIG. 2, the first stage of level shifting unit 71 includes a first transistor M1, a second transistor M2 . . . and a twelfth transistor M12. The first transistor M1, the second transistor M2, the third transistor M3, the fourth transistor M4, the ninth transistor M9, and tenth transistor M10 are N-type MOSFETs; the fifth transistor M5, the sixth transistor M6, the seventh transistor M7, the eighth transistor M8, the eleventh transistor M11, and twelfth transistor M12 are P-type MOSFETs.

The second stage of level shifting unit 72 includes a thirteenth transistor M13, a fourteenth transistor M14 . . . and an eighteenth transistor M18. The thirteenth transistor M13 and the fourteenth transistor M14 are N-type MOSFETs; the fifteenth transistor M15, the sixteenth transistor M16, the seventeenth transistor M17, and the eighteenth transistor M18 are P-type MOSFETs.

The second stage of level shifting unit 73 includes a nineteenth transistor M19, a twentieth transistor M20 . . . and a twenty-fourth transistor M24. The nineteenth transistor M19 and the twentieth transistor M20 are N-type MOSFETs; the twenty-first transistor M21, the twenty-second transistor M22, the twenty-third transistor M23, and the twenty-fourth transistor M24 are P-type MOSFETs.

Input terminals IN and INB of the first stage of level shifting unit 71 have an input voltage range between 0V and 1.5V; output terminals OUTP and OUTPB of the second stage of level shifting unit 72 have an output voltage range between 5V and 10V; output terminals OUTN and OUTNB of the third stage of level shifting unit 73 have an output voltage range between 0V and 5V; the ground voltage AGND is 0V; the operating voltage AVDD is 10V; the half-operating voltage hAVDD is 5V; the first middle voltage VCL1 is 6.5V; the second middle voltage VCL2 is 3.5V.

At first, it is assumed that the input voltages received by the input terminals IN and INB of the first stage of level shifting unit 71 are 0V and 1.5V respectively; the voltage level of the node A is the first middle voltage VCL1; the voltage level of the node B is the half-operating voltage hAVDD; the voltage level of the node C is (the second middle voltage VCL2 plus the threshold voltage VT); the voltage level of the node D is the first middle voltage VCL1; voltage levels of the two output terminals OUTP and OUTPB of the second stage of level shifting unit 72 are the half-operating voltage hAVDD and the operating voltage AVDD respectively; voltage levels of the two output terminals OUTN and OUTNB of the second stage of level shifting unit 73 are the ground voltage AGND and the half-operating voltage hAVDD respectively.

After the input voltage signal is converted and the input voltage received by the input terminal IN becomes 1.5V and the input voltage received by the input terminal INB becomes 0V, the voltage level of the node D is under a signal fighting and lowered from the original first middle voltage VCL1 to (the first middle voltage VCL1 minus the threshold voltage VT), and at last further lowered to (the second middle voltage VCL2 plus the threshold voltage VT), so that the eleventh transistor M11 is switched on and the node B is charged from the half-operating voltage hAVDD to the first middle voltage VCL1. Afterward, the eighth transistor M8 is switched on and the node C is charged from (the second middle voltage VCL2 plus the threshold voltage VT) to (the half-operating voltage hAVDD plus the threshold voltage VT), and at last further charged to the first middle voltage VCL1, so that the tenth transistor M10 is switched on and the node A is discharged from the first middle voltage VCL1 to the half-operating voltage hAVDD. The node A and the node B output the voltage signals V2 and V1 to the second stage of level shifting unit 72 respectively to be converted to another power domain.

It should be noticed that the node C cannot be charged until the voltage level of the node D is lowered to (the first middle voltage VCL1 minus the threshold voltage VT); therefore, there will be a time difference between the signal conversion time of the node C and the signal conversion time of the node D; that is to say, the signal conversion times of the node C and the node D cannot be synchronous; therefore, the signal conversion times of the node A and the node B cannot be synchronous with the signal conversion times of the two output terminals OUTP and OUTPB of the second stage of level shifting unit 72.

On the other hand, compared to the output voltage signals of the two output terminals OUTP and OUTPB of the second stage of level shifting unit 72 being boosted by two stages of level shifting circuit to reach the target voltage range of the power domain of the second stage of level shifting unit 72, the output voltage signals of the two output terminals OUTN and OUTNB of the second stage of level shifting unit 73 only needs to be boosted by one stage of level shifting circuit to reach the target voltage range of the power domain of the second stage of level shifting unit 73. Therefore, the signal conversion output time needed by the two output terminals OUTN and OUTNB of the second stage of level shifting unit 73 will be shorter than that needed by the two output terminals OUTP and OUTPB of the second stage of level shifting unit 72. In other words, the signal conversion output time of the two output terminals OUTN and OUTNB of the second stage of level shifting unit 73 is not synchronous with that of the two output terminals OUTP and OUTPB of the second stage of level shifting unit 72.

Above all, it can be found that in the level shifter 7 of the conventional driving circuit, the signal conversion times of the output terminals OUTP, OUTPB, OUTN, and OUTNB of the second stage of level shifting units 72 and 73 fail to be synchronous; therefore, the multi-power domain signal level-shifting efficiency and the performance of the driving circuit of the display will be seriously affected accordingly.

SUMMARY OF THE INVENTION

Therefore, the invention provides a level shifter applied to a driving circuit of a display to solve the above-mentioned problems.

A preferred embodiment of the invention is a level shifter. In this embodiment, the level shifter is applied to a driving circuit of a display to boost voltage signals of different power domains. The level shifter includes a first stage of level shifting unit, a second stage of level shifting unit, a third stage of level shifting unit, and another third stage of level shifting unit.

The first stage of level shifting unit includes a first transistor, a second transistor, a third transistor, a fourth transistor, a fifth transistor, a sixth transistor, a seventh transistor, and a eighth transistor, wherein the first transistor, the second transistor, the third transistor, the fourth transistor are N-type MOSFETs; the fifth transistor, the sixth transistor, the seventh transistor, and the eighth transistor are P-type MOSFETs; the first transistor, the third transistor, the fifth transistor, and the seventh transistor are coupled in series between a ground voltage and a first middle voltage; the second transistor, the fourth transistor, the sixth transistor, and the eighth transistor are coupled in series between the ground voltage and the first middle voltage; gate electrodes of the first transistor and the second transistor are coupled to an input voltage signal; gate electrodes of the third transistor, the fourth transistor, the fifth transistor, and the sixth transistor are coupled to a second middle voltage smaller than the first middle voltage; base electrodes of the first transistor, the second transistor, the third transistor, and the fourth transistor are coupled to the ground voltage; base electrodes of the fifth transistor, the sixth transistor, the seventh transistor, and the eighth transistor are coupled to the first middle voltage; a gate electrode of the seventh transistor is coupled to a first node between the sixth transistor and the eighth transistor; a gate electrode of the eighth transistor is coupled to a second node between the fifth transistor and the seventh transistor; a third node is disposed between the third transistor and the fifth transistor; a fourth node is disposed between the fourth transistor and the sixth transistor.

The second stage of level shifting unit includes a ninth transistor, a tenth transistor, an eleventh transistor, and a twelfth transistor, wherein the ninth transistor and the tenth transistor are N-type MOSFETs; the eleventh transistor and the twelfth transistor are P-type MOSFETs; the ninth transistor and the eleventh transistor are coupled between the second middle voltage and the first middle voltage; the tenth transistor and the twelfth transistor are coupled between the second middle voltage and the first middle voltage; base electrodes of the ninth transistor and the tenth transistor are coupled to the second middle voltage; base electrodes of the eleventh transistor and the twelfth transistor are coupled to the first middle voltage; gate electrodes of the ninth transistor and the eleventh transistor are coupled to the third node between the third transistor and the fifth transistor of the first stage of level shifting unit; gate electrodes of the tenth transistor and the twelfth transistor are coupled to a fifth node between the ninth transistor and the eleventh transistor; a sixth node is disposed between the tenth transistor and the twelfth transistor.

The third stage of level shifting unit of a first power domain includes a thirteenth transistor, a fourteenth transistor, a fifteenth transistor, a sixteenth transistor, a seventeenth transistor, and an eighteenth transistor, wherein the thirteenth transistor and the fourteenth transistor are N-type MOSFETs; the fifteenth transistor, the sixteenth transistor, the seventeenth transistor, and the eighteenth transistor are P-type MOSFETs; the thirteenth transistor, the fifteenth transistor, and the seventeenth transistor are coupled between a half-operating voltage and an operating voltage, wherein the half-operating voltage is a half of the operating voltage; the fourteenth transistor, the sixteenth transistor, and the eighteenth transistor are coupled between the half-operating voltage and the operating voltage; base electrodes of the thirteen transistor and the fourteenth transistor are coupled to the half-operating voltage; base electrodes of the fifteenth transistor, the sixteenth transistor, the seventeenth transistor, and the eighteenth transistor are coupled to the operating voltage; gate electrodes of the thirteen transistor and the fifteenth transistor are coupled to the fifth node between the ninth transistor and the eleventh transistor of the second stage of level shifting unit; gate electrodes of the fourteen transistor and the sixteenth transistor are coupled to the sixth node between the tenth transistor and the twelfth transistor of the second stage of level shifting unit; the seventeenth transistor is coupled between the fourteenth transistor and the sixteenth transistor through a first output terminal; the eighteenth transistor is coupled between the thirteenth transistor and the fifteenth transistor through a second output terminal; the third stage of level shifting unit outputs an output voltage signal boosted by the first power domain through the first output terminal and the second output terminal.

The another third stage of level shifting unit includes a nineteenth transistor, a twentieth transistor, a twenty-first transistor, a twenty-second transistor, a twenty-third transistor, and a twenty-fourth transistor, wherein the nineteenth transistor, the twentieth transistor, the twenty-first transistor, and the twenty-second transistor are N-type MOSFETs; the twenty-third transistor and the twenty-fourth transistor are P-type MOSFETs; the nineteenth transistor, the twenty-first transistor, and the twenty-third transistor are coupled between the ground voltage and the half-operating voltage; the twentieth transistor, the twenty-second transistor, and the twenty-fourth transistor are coupled between the ground voltage and the half-operating voltage; base electrodes of the nineteenth transistor, the twentieth transistor, the twenty-first transistor, and the twenty-second transistor are coupled to the ground voltage; base electrodes of the twenty-third transistor and the twenty-fourth transistor are coupled to the half-operating voltage; gate electrodes of the twenty-first transistor and the twenty-third transistor are coupled to the fifth node between the ninth transistor and the eleventh transistor of the second stage of level shifting unit; gate electrodes of the twenty-second transistor and the twenty-fourth transistor are coupled to the sixth node between the tenth transistor and the twelfth transistor of the second stage of level shifting unit; the nineteenth transistor is coupled between the twenty-second transistor and the twenty-fourth transistor through a third output terminal; the twentieth transistor is coupled between the twenty-first transistor and the twenty-third transistor through a fourth output terminal; the another third stage of level shifting unit outputs another output voltage signal boosted by the second power domain through the third output terminal and the fourth output terminal.

In an embodiment, the operating voltage is 10 volts, the half-operating voltage is 5 volts, the first middle voltage is 6.5 volts, the second middle voltage is 3.5 volts, and the ground voltage is 0 volt.

In an embodiment, the input voltage signal has a voltage range between 0~1.5 volts, the output voltage signal has a voltage range between 5~10 volts, and the another output voltage signal has a voltage range between 0~5 volts.

In an embodiment, the another output voltage signal and the output voltage signal have the same logic and different voltage ranges.

In an embodiment, when a conversion behavior at the third node between the third transistor and the fifth transistor of the first stage of level shifting unit is done, conversion behaviors at the fifth node and the sixth node of the second stage of level shifting unit are also done immediately to avoid a conversion time difference between a positive-phase signal and a negative-phase signal.

In an embodiment, the input voltage signal received by the gate electrodes of the first transistor and the second transistor of the first stage of level shifting unit is boosted by the first stage of level shifting unit, the second stage of level shifting unit, and the third stage of level shifting unit in order to reach a voltage range of the first power domain to form the output voltage signal outputted by the first output terminal and the second output terminal of the third stage of level shifting unit.

In an embodiment, the input voltage signal received by the gate electrodes of the first transistor and the second transistor of the first stage of level shifting unit is boosted by the first stage of level shifting unit, the second stage of level shifting unit, and the another third stage of level shifting unit in order to reach a voltage range of the second power domain to form the another output voltage signal outputted by the third output terminal and the fourth output terminal of the another third stage of level shifting unit.

In an embodiment, a first signal conversion time at the first output terminal and the second output terminal of the third stage of level shifting unit of the first power domain is synchronous with a second signal conversion time at the third output terminal and the fourth output terminal of the another third stage of level shifting unit of the second power domain.

In an embodiment, the first transistor, the second transistor, the third transistor, and the fourth transistor all have a first threshold voltage and a first breakdown voltage; the fifth transistor, the sixth transistor, the seventh transistor, and the eighth transistor all have a second threshold voltage and a second breakdown voltage; the first transistor, the second transistor, the third transistor, and the fourth transistor all have an operating voltage range between the ground voltage and (the second middle voltage minus the first threshold voltage) and voltages crossing the first transistor, the second transistor, the third transistor, and the fourth transistor are all smaller than the first breakdown voltage; the fifth transistor, the sixth transistor, the seventh transistor, and the eighth transistor all have an operating voltage range between (the second middle voltage plus the second threshold voltage) and the first middle voltage and voltages crossing the fifth transistor, the sixth transistor, the seventh transistor, and the eighth transistor are all smaller than the second breakdown voltage; the first breakdown voltage and the second breakdown voltage are both larger than 0.

In an embodiment, the third stage of level shifting unit of the first power domain and the another third stage of level shifting unit of the second power domain both receive the same voltage signal boosted by the first stage of level shifting unit and the second stage of level shifting unit from the fifth node between the ninth transistor and the eleventh transistor of the second stage of level shifting unit and the sixth node between the tenth transistor and the twelfth transistor of the second stage of level shifting unit.

Compared to the prior art, in the level shifter 1 of the driving circuit of the invention, when a conversion behavior at the node E between the third transistor M3 and the fifth transistor M5 of the first stage of level shifting unit 10 is done, conversion behaviors at the nodes A and B of the second stage of level shifting unit 11 are also done immediately; therefore, a conversion time difference between a positive-phase signal and a negative-phase signal can be avoided.

In addition, the output voltage signals outputted by the two output terminals OUTP and OUTPB of the third stage of level shifting unit 12 and the output voltage signals outputted by the two output terminals OUTN and OUTNB of the third stage of level shifting unit 13 are all formed by the input voltage signal received by the two input terminals IN and INB of the first stage of level shifting unit 10 being boosted to the target voltages of different power domains by two stages of level-shifting circuit; therefore, the signal conversion time of the two output terminals OUTP and OUTPB of the third stage of level shifting unit 12 and the signal conversion time of the two output terminals OUTN and OUTNB of the third stage of level shifting unit 13 can be synchronous even they belong to different power domains, so that the condition that the signal conversion times of the output terminals OUTP, OUTPB, OUTN, and OUTNB of the second stage of level shifting units 72 and 73 fail to be synchronous in the conventional level shifter 7 can be effectively avoided to improve the multi-power domain signal level-shifting efficiency and the performance of the driving circuit of the display.

Moreover, since the number (24) of the transistors used in the level shifter 1 of the driving circuit of the invention is the same with the number (24) of the transistors used in the level shifter 7 of the prior art, the manufacturing cost of the driving circuit will not be increased.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a level shifter of a driving circuit. In this embodiment, the level shifter is applied to a driving circuit of a display, but not limited to this.

Figure 1:
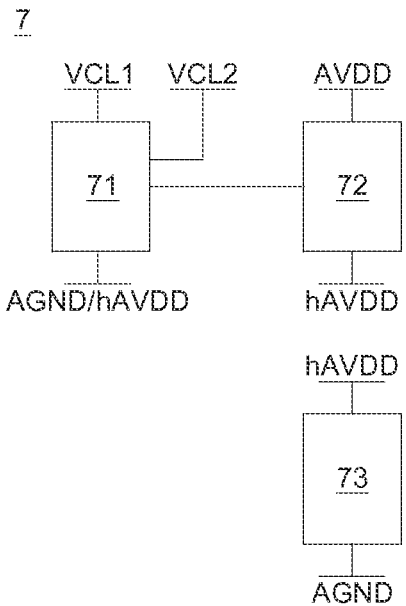
FIG. 1 illustrates a schematic diagram of the level shifter of the conventional driving circuit.
Figure 2:
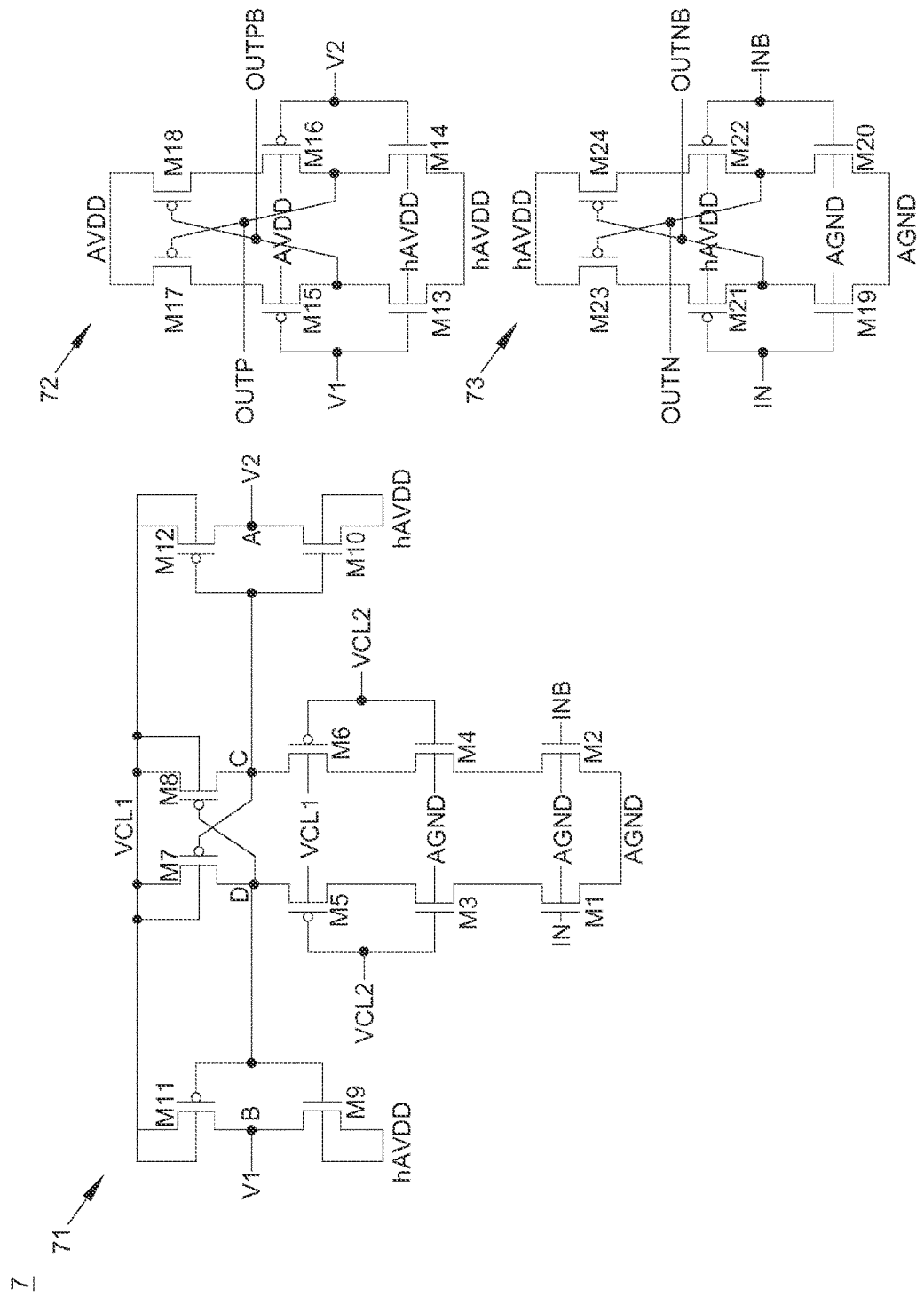
FIG. 2 illustrates a detailed circuit diagram of the level shifter of FIG. 1.
Figure 3:
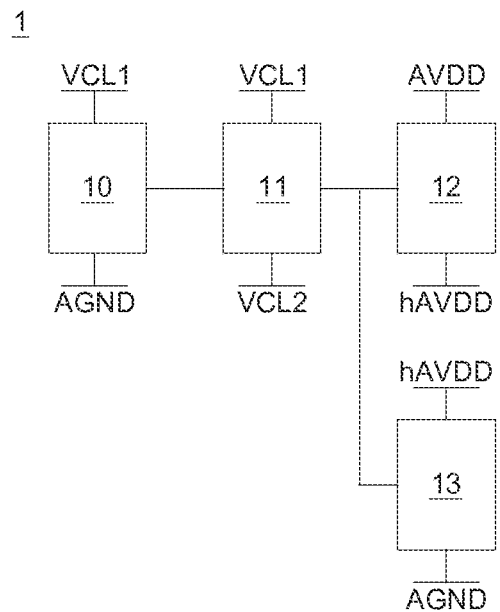
FIG. 3 illustrates a functional block diagram of the level shifter in a preferred embodiment of the invention.

At first, please refer to FIG. 3. FIG. 3 illustrates a functional block diagram of the level shifter in this embodiment. As shown in FIG. 3, the level shifter 1 includes a first stage of level shifting unit 10, a second stage of level shifting unit 11, and two third stage of level shifting units 12 and 13 of two different power domains. The first stage of level shifting unit 10 is coupled between the ground voltage AGND and the first middle voltage VCL1; the second stage of level shifting unit 11 is coupled between the second middle voltage VCL2 and the first middle voltage VCL1; the third stage of level shifting unit 12 of the first power domain is coupled between the half-operating voltage hAVDD and the operating voltage AVDD; the third stage of level shifting unit 13 of the second power domain is coupled between the ground voltage AGND and the half-operating voltage hAVDD; the first stage of level shifting unit 10 is coupled to the second stage of level shifting unit 11; the second stage of level shifting unit 11 is coupled to the two third stage of level shifting units 12 and 13 respectively.

Figure 4:
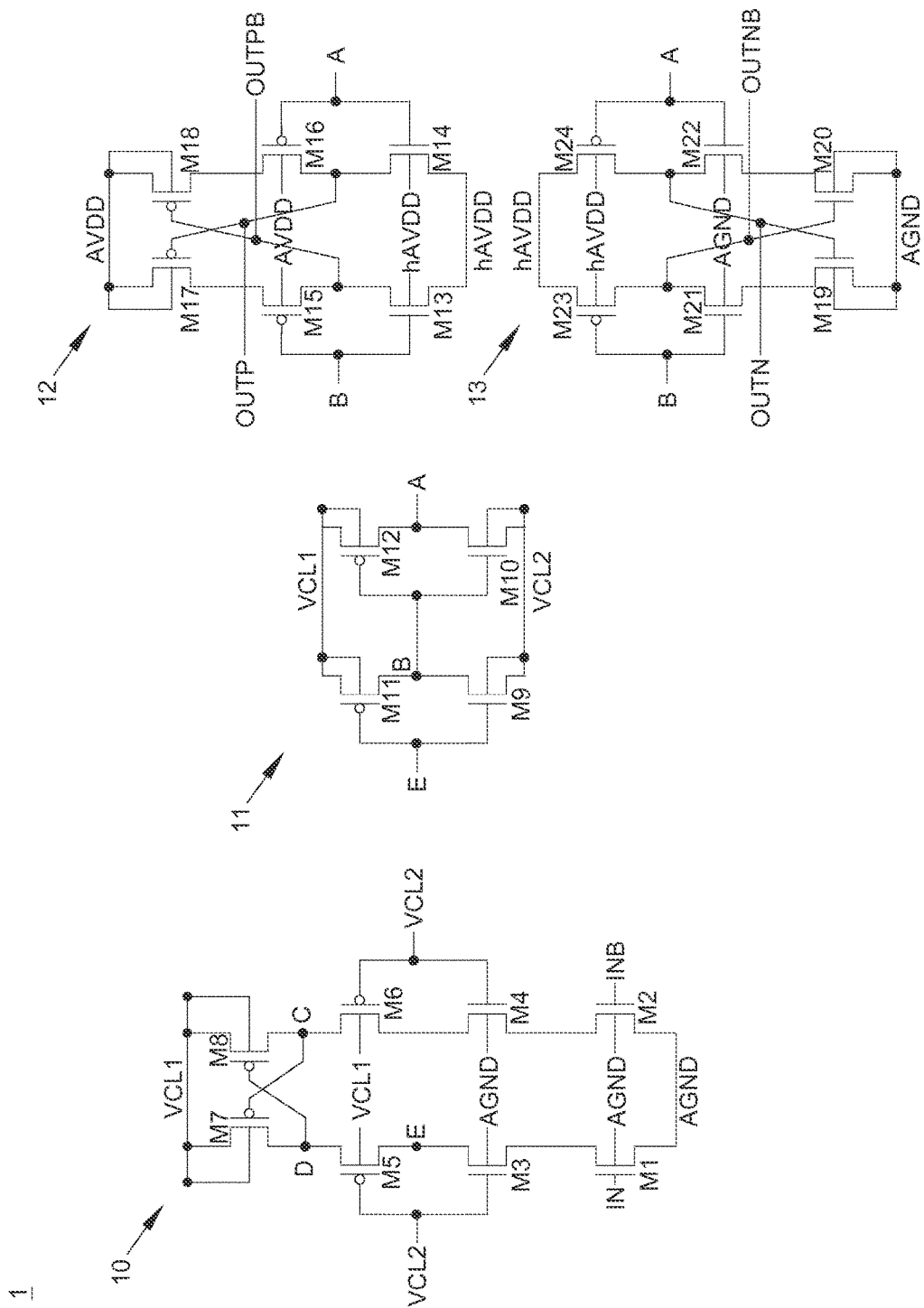
FIG. 4 illustrates a detailed circuit diagram of the level shifter of FIG. 3.

Then, please refer to FIG. 4. FIG. 4 illustrates a detailed circuit diagram of the level shifter 1 of FIG. 3. As shown in FIG. 4, the first stage of level shifting unit 10 of the level shifter 1 includes a first transistor M1, a second transistor M2, a third transistor M3, a fourth transistor M4, a fifth transistor M5, a sixth transistor M6, a seventh transistor M7, and a eighth transistor M8, wherein the first transistor M1, the second transistor M2, the third transistor M3, the fourth transistor M4 are N-type MOSFETs; the fifth transistor M5, the sixth transistor M6, the seventh transistor M7, and the eighth transistor M8 are P-type MOSFETs.

In this embodiment, the first transistor M1, the third transistor M3, the fifth transistor M5, and the seventh transistor M7 are coupled in series between the ground voltage AGND and the first middle voltage VCL1; the second transistor M2, the fourth transistor M4, the sixth transistor M6, and the eighth transistor M8 are coupled in series between the ground voltage AGND and the first middle voltage VCL1; gate electrodes of the first transistor M1 and the second transistor M2 are coupled to input voltage signals IN and INB; gate electrodes of the third transistor M3, the fourth transistor M4, the fifth transistor M5, and the sixth transistor M6 are coupled to the second middle voltage VCL2 smaller than the first middle voltage VCL1.

Base electrodes of the first transistor M1, the second transistor M2, the third transistor M3, and the fourth transistor M4 are coupled to the ground voltage AGND; base electrodes of the fifth transistor M5, the sixth transistor M6, the seventh transistor M7, and the eighth transistor M8 are coupled to the first middle voltage VCL1; a gate electrode of the seventh transistor M7 is coupled to a node C between the sixth transistor M6 and the eighth transistor M8; a gate electrode of the eighth transistor M8 is coupled to a node D between the fifth transistor M5 and the seventh transistor M7; a node E is disposed between the third transistor M3 and the fifth transistor M5; a node F is disposed between the fourth transistor M4 and the sixth transistor M6.

The second stage of level shifting unit 11 includes a ninth transistor M9, a tenth transistor M10, an eleventh transistor M11, and a twelfth transistor M12, wherein the ninth transistor M9 and the tenth transistor M10 are N-type MOSFETs; the eleventh transistor M11 and the twelfth transistor M12 are P-type MOSFETs. The ninth transistor M9 and the eleventh transistor M11 are coupled between the second middle voltage VCL2 and the first middle voltage VCL1; the tenth transistor M10 and the twelfth transistor M12 are coupled between the second middle voltage VCL2 and the first middle voltage VCL1. Base electrodes of the ninth transistor M9 and the tenth transistor M10 are coupled to the second middle voltage VCL2; base electrodes of the eleventh transistor M11 and the twelfth transistor M12 are coupled to the first middle voltage VCL1. Gate electrodes of the ninth transistor M9 and the eleventh transistor M11 are coupled to the node E between the third transistor M3 and the fifth transistor M5 of the first stage of level shifting unit 10; gate electrodes of the tenth transistor M10 and the twelfth transistor M12 are coupled to the node B between the ninth transistor M9 and the eleventh transistor M11; the node A is disposed between the tenth transistor M10 and the twelfth transistor M12.

The third stage of level shifting unit 12 of the first power domain includes a thirteenth transistor M13, a fourteenth transistor M14, a fifteenth transistor M15, a sixteenth transistor M16, a seventeenth transistor M17, and an eighteenth transistor M18, wherein the thirteenth transistor M13 and the fourteenth transistor M14 are N-type MOSFETs; the fifteenth transistor M15, the sixteenth transistor M16, the seventeenth transistor M17, and the eighteenth transistor M18 are P-type MOSFETs.

The thirteenth transistor M13, the fifteenth transistor M15, and the seventeenth transistor M17 are coupled between the half-operating voltage hAVDD and the operating voltage AVDD, wherein the half-operating voltage hAVDD is a half of the operating voltage AVDD. The fourteenth transistor M14, the sixteenth transistor M16, and the eighteenth transistor M18 are coupled between the half-operating voltage hAVDD and the operating voltage AVDD; base electrodes of the thirteen transistor M13 and the fourteenth transistor M14 are coupled to the half-operating voltage hAVDD; base electrodes of the fifteenth transistor M15, the sixteenth transistor M16, the seventeenth transistor M17, and the eighteenth transistor M18 are coupled to the operating voltage AVDD; gate electrodes of the thirteen transistor M13 and the fifteenth transistor M15 are coupled to the node B between the ninth transistor M9 and the eleventh transistor M11 of the second stage of level shifting unit 11; gate electrodes of the fourteen transistor M14 and the sixteenth transistor M16 are coupled to the node A between the tenth transistor M10 and the twelfth transistor M12 of the second stage of level shifting unit 11; the seventeenth transistor M17 is coupled between the fourteenth transistor M14 and the sixteenth transistor M16 through a first output terminal OUTP; the eighteenth transistor M18 is coupled between the thirteenth transistor M13 and the fifteenth transistor M15 through a second output terminal OUTPB; the third stage of level shifting unit 12 outputs an output voltage signal boosted by the first power domain through the first output terminal OUTP and the second output terminal OUTPB.

The third stage of level shifting unit 13 of the second power domain includes a nineteenth transistor M19, a twentieth transistor M20, a twenty-first transistor M21, a twenty-second transistor M22, a twenty-third transistor M23, and a twenty-fourth transistor M24, wherein the nineteenth transistor M19, the twentieth transistor M20, the twenty-first transistor M21, and the twenty-second transistor M22 are N-type MOSFETs; the twenty-third transistor M23 and the twenty-fourth transistor M24 are P-type MOSFETs.

The nineteenth transistor M19, the twenty-first transistor M21, and the twenty-third transistor M23 are coupled between the ground voltage AGND and the half-operating voltage hAVDD. The twentieth transistor M20, the twenty-second transistor M22, and the twenty-fourth transistor M24 are coupled between the ground voltage AGND and the half-operating voltage hAVDD; base electrodes of the nineteenth transistor M19, the twentieth transistor M20, the twenty-first transistor M21, and the twenty-second transistor M22 are coupled to the ground voltage AGND; base electrodes of the twenty-third transistor M23 and the twenty-fourth transistor M24 are coupled to the half-operating voltage hAVDD; gate electrodes of the twenty-first transistor M21 and the twenty-third transistor M23 are coupled to the node B between the ninth transistor M9 and the eleventh transistor M11 of the second stage of level shifting unit 11; gate electrodes of the twenty-second transistor M22 and the twenty-fourth transistor M24 are coupled to the node A between the tenth transistor M10 and the twelfth transistor M12 of the second stage of level shifting unit 11; the nineteenth transistor M19 is coupled between the twenty-second transistor M22 and the twenty-fourth transistor M24 through a third output terminal OUTN; the twentieth transistor M20 is coupled between the twenty-first transistor M21 and the twenty-third transistor M23 through a fourth output terminal OUTNB; the third stage of level shifting unit 13 outputs another output voltage signal boosted by the second power domain through the third output terminal OUTN and the fourth output terminal OUTNB.

In this embodiment, in the level shifter 1, the gate electrodes of the ninth transistor M9 and the eleventh transistor M11 of the second stage of level shifting unit 11 are coupled to the node E between the third transistor M3 and the fifth transistor M5 of the first stage of level shifting unit 10, and the gate electrodes of the tenth transistor M10 and the twelfth transistor M12 of the second stage of level shifting unit 11 are coupled to the node B between the ninth transistor M9 and the eleventh transistor M11 of the second stage of level shifting unit 11. In addition, the input voltage range of the third stage of level shifting unit 13 of the level shifter 1 is adjusted, so that the voltage range VCL1~VCL2 of the node A and node B of the second stage of level shifting unit 11 can be inputted into the third stage of level shifting units 12 and 13, and then the third stage of level shifting units 12 and 13 perform level-shifting of their own power domains respectively; for example, the third stage of level shifting unit 12 performs level-shifting of the voltage range between the half-operating voltage hAVDD and the operating voltage AVDD on the voltage signals; the third stage of level shifting unit 13 performs level-shifting of the voltage range between the ground voltage AGND and the half-operating voltage hAVDD on the voltage signals.

When a conversion behavior at the node E between the third transistor M3 and the fifth transistor M5 of the first stage of level shifting unit 10 is done, conversion behaviors at the node A and the node B of the second stage of level shifting unit 11 are also done immediately to avoid a conversion time difference between a positive-phase signal and a negative-phase signal.

On the other hand, the output voltage signals outputted by the two output terminals OUTP and OUTPB of the third stage of level shifting unit 12 and the output voltage signals outputted by the two output terminals OUTN and OUTNB of the third stage of level shifting unit 13 are all formed by the input voltage signal received by the two input terminals IN and INB of the first stage of level shifting unit 10 being boosted to the target voltage ranges of different power domains by two stages of level-shifting circuit; for example, the target voltage range of the first power domain ranges between the half-operating voltage hAVDD and the operating voltage AVDD; the target voltage range of the second power domain ranges between the ground voltage AGND and the half-operating voltage hAVDD.

Figure 5:
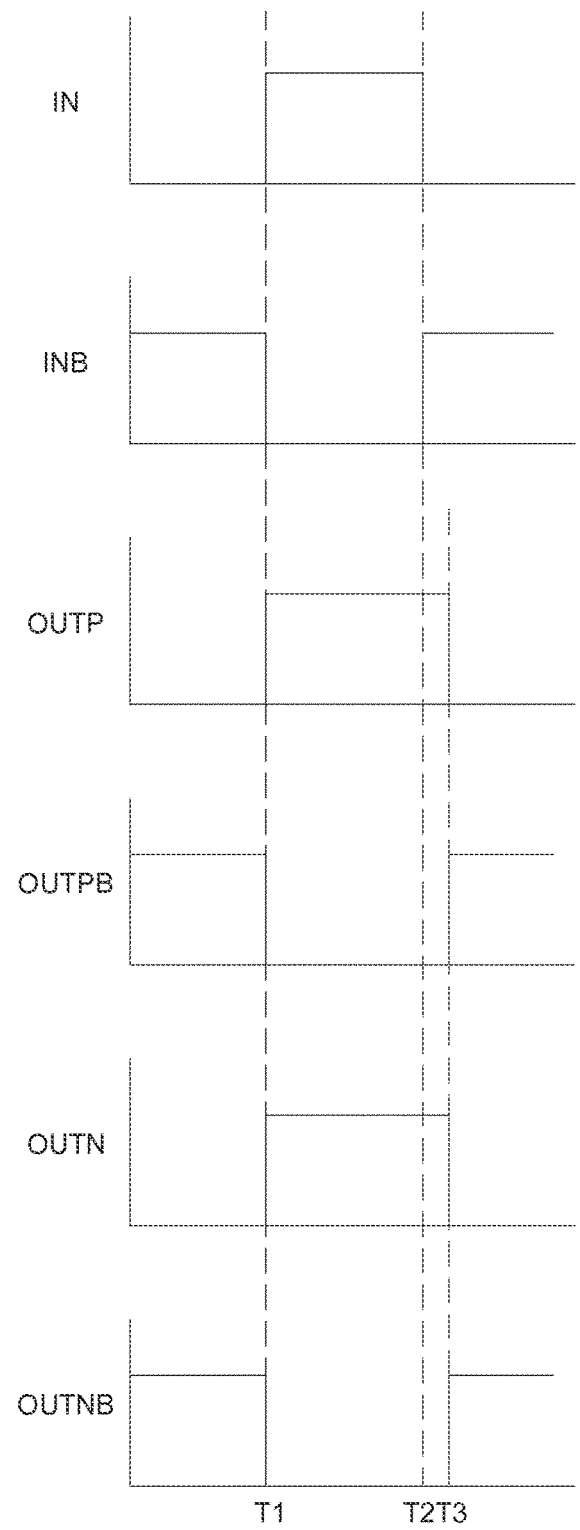
FIG. 5 illustrates the timing diagrams of the input voltage signals and output voltage signals.

Please refer to FIG. 5. FIG. 5 illustrates the timing diagrams of the input voltage signals of the input terminals IN and INB and output voltage signals of the output terminals OUTP, OUTPB, OUTN, and OUTNB. As shown in FIG. 5, it is assumed that the two input voltage signals received by the input terminals IN and INB have reversed phases and their voltage levels are shifted at the times T1 and T2 from lower level to higher level or from higher level to lower level.

The input voltage signals of the two output terminals OUTP and OUTPB of the third stage of level shifting unit 12 and the input voltage signals of the two output terminals OUTN and OUTNB of the third stage of level shifting unit 13 are all boosted from the lower level to the higher level or from higher level to lower level at the time T3 later than the time T2. That is to say, the signal conversion time of the two output terminals OUTP and OUTPB of the third stage of level shifting unit 12 and the signal conversion time of the two output terminals OUTN and OUTNB of the third stage of level shifting unit 13 can be synchronous even they belong to different power domains, so that the condition that the signal conversion times of the output terminals OUTP, OUTPB, OUTN, and OUTNB of the second stage of level shifting units 72 and 73 fail to be synchronous in the conventional level shifter 7 can be effectively avoided to improve the multi-power domain signal level-shifting efficiency and the performance of the driving circuit of the display.

Compared to the prior art, in the level shifter 1 of the driving circuit of the invention, when a conversion behavior at the node E between the third transistor M3 and the fifth transistor M5 of the first stage of level shifting unit 10 is done, conversion behaviors at the nodes A and B of the second stage of level shifting unit 11 are also done immediately; therefore, a conversion time difference between a positive-phase signal and a negative-phase signal can be avoided.

In addition, the output voltage signals outputted by the two output terminals OUTP and OUTPB of the third stage of level shifting unit 12 and the output voltage signals outputted by the two output terminals OUTN and OUTNB of the third stage of level shifting unit 13 are all formed by the input voltage signal received by the two input terminals IN and INB of the first stage of level shifting unit 10 being boosted to the target voltages of different power domains by two stages of level-shifting circuit; therefore, the signal conversion time of the two output terminals OUTP and OUTPB of the third stage of level shifting unit 12 and the signal conversion time of the two output terminals OUTN and OUTNB of the third stage of level shifting unit 13 can be synchronous even they belong to different power domains, so that the condition that the signal conversion times of the output terminals OUTP, OUTPB, OUTN, and OUTNB of the second stage of level shifting units 72 and 73 fail to be synchronous in the conventional level shifter 7 can be effectively avoided to improve the multi-power domain signal level-shifting efficiency and the performance of the driving circuit of the display.

Moreover, since the number (24) of the transistors used in the level shifter 1 of the driving circuit of the invention is the same with the number (24) of the transistors used in the level shifter 7 of the prior art, the manufacturing cost of the driving circuit will not be increased.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A level shifter, applied to a driving circuit of a display to boost voltage signals of different power domains, the level shifter comprising:

a first stage of level shifting unit comprising a first transistor, a second transistor, a third transistor, a fourth transistor, a fifth transistor, a sixth transistor, a seventh transistor, and an eighth transistor, wherein the first transistor, the second transistor, the third transistor, the fourth transistor are N-type MOSFETs;

the fifth transistor, the sixth transistor, the seventh transistor, and the eighth transistor are P-type MOSFETs; the first transistor, the third transistor, the fifth transistor, and the seventh transistor are connected in series between a ground voltage and a first middle voltage;

the second transistor, the fourth transistor, the sixth transistor, and the eighth transistor are connected in series between the ground voltage and the first middle voltage; gate electrodes of the first transistor and the second transistor are directly connected to an input voltage signal; gate electrodes of the third transistor, the fourth transistor, the fifth transistor, and the sixth transistor are directly connected to a second middle voltage smaller than the first middle voltage;

base electrodes of the first transistor, the second transistor, the third transistor, and the fourth transistor are directly connected to the ground voltage;

base electrodes of the fifth transistor, the sixth transistor, the seventh transistor, and the eighth transistor are directly connected to the first middle voltage;

a gate electrode of the seventh transistor is directly connected to a first node between the sixth transistor and the eighth transistor;

a gate electrode of the eighth transistor is directly connected to a second node between the fifth transistor and the seventh transistor;

a third node is disposed between the third transistor and the fifth transistor;

a fourth node is disposed between the fourth transistor and the sixth transistor;

a second stage of level shifting unit comprising a ninth transistor, a tenth transistor, an eleventh transistor, and a twelfth transistor, wherein the ninth transistor and the tenth transistor are N-type MOSFETs;

the eleventh transistor and the twelfth transistor are P-type MOSFETs;

the ninth transistor and the eleventh transistor are connected between the second middle voltage and the first middle voltage;

the tenth transistor and the twelfth transistor are connected between the second middle voltage and the first middle voltage;

base electrodes of the ninth transistor and the tenth transistor are directly connected to the second middle voltage;

base electrodes of the eleventh transistor and the twelfth transistor are directly connected to the first middle voltage;

gate electrodes of the ninth transistor and the eleventh transistor are directly connected to the third node between the third transistor and the fifth transistor of the first stage of level shifting unit;

gate electrodes of the tenth transistor and the twelfth transistor are directly connected to a fifth node between the ninth transistor and the eleventh transistor;

a sixth node is disposed between the tenth transistor and the twelfth transistor;

a third stage of level shifting unit of a first power domain, the third stage of level shifting unit comprising a thirteenth transistor, a fourteenth transistor, a fifteenth transistor, a sixteenth transistor, a seventeenth transistor, and an eighteenth transistor, wherein the thirteenth transistor and the fourteenth transistor are N-type MOSFETs; the fifteenth transistor, the sixteenth transistor, the seventeenth transistor, and the eighteenth transistor are P-type MOSFETs;

the thirteenth transistor, the fifteenth transistor, and the seventeenth transistor are connected between a half-operating voltage and an operating voltage, wherein the half-operating voltage is a half of the operating voltage; the fourteenth transistor, the sixteenth transistor, and the eighteenth transistor are connected between the half-operating voltage and the operating voltage; base electrodes of the thirteenth transistor and the fourteenth transistor are t directly connected o the half-operating voltage;

base electrodes of the fifteenth transistor, the sixteenth transistor, the seventeenth transistor, and the eighteenth transistor are directly connected to the operating voltage;

gate electrodes of the thirteenth transistor and the fifteenth transistor are directly connected to the fifth node between the ninth transistor and the eleventh transistor of the second stage of level shifting unit;

gate electrodes of the fourteenth transistor and the sixteenth transistor are directly connected to the sixth node between the tenth transistor and the twelfth transistor of the second stage of level shifting unit;

the seventeenth transistor is connected between the fourteenth transistor and the sixteenth transistor through a first output terminal;

the eighteenth transistor is connected between the thirteenth transistor and the fifteenth transistor through a second output terminal;

the third stage of level shifting unit outputs an output voltage signal boosted by the first power domain through the first output terminal and the second output terminal; and another third stage of level shifting unit of a second power domain different from the first power domain, the another third stage of level shifting unit comprising a nineteenth transistor, a twentieth transistor, a twenty-first transistor, a twenty-second transistor, a twenty-third transistor, and a twenty-fourth transistor, wherein the nineteenth transistor, the twentieth transistor, the twenty-first transistor, and the twenty-second transistor are N-type MOSFETs;

the twenty-third transistor and the twenty-fourth transistor are P-type MOSFETs;

the nineteenth transistor, the twenty-first transistor, and the twenty-third transistor are connected between the ground voltage and the half-operating voltage;

the twentieth transistor, the twenty-second transistor, and the twenty-fourth transistor are connected between the ground voltage and the half-operating voltage;

base electrodes of the nineteenth transistor, the twentieth transistor, the twenty-first transistor, and the twenty-second transistor are directly connected to the ground voltage;

base electrodes of the twenty-third transistor and the twenty-fourth transistor are directly connected to the half-operating voltage;

gate electrodes of the twenty-first transistor and the twenty-third transistor are directly connected to the fifth node between the ninth transistor and the eleventh transistor of the second stage of level shifting unit;

gate electrodes of the twenty-second transistor and the twenty-fourth transistor are directly connected to the sixth node between the tenth transistor and the twelfth transistor of the second stage of level shifting unit;

the nineteenth transistor is directly connected between the twenty-second transistor and the twenty-fourth transistor through a third output terminal;

the twentieth transistor is directly connected between the twenty-first transistor and the twenty-third transistor through a fourth output terminal;

the another third stage of level shifting unit outputs another voltage signal boosted by the second power domain through the third output terminal and the fourth output terminal.

2. The level shifter of claim 1, wherein the operating voltage is 10 volts, the half-operating voltage is 5 volts, the first middle voltage is 6.5 volts, the second middle voltage is 3.5 volts, and the ground voltage is 0 volt.

3. The level shifter of claim 1, wherein the input voltage signal has a voltage range between 0~1.5 volts, the output voltage signal has a voltage range between 5~10 volts, and the another output voltage signal has a voltage range between 0~5 volts.

4. The level shifter of claim 1, wherein the another output voltage signal and the output voltage signal have the same logic and different voltage ranges.

5. The level shifter of claim 1, wherein when a conversion behavior at the third node between the third transistor and the fifth transistor of the first stage of level shifting unit is done, conversion behaviors at the fifth node and the sixth node of the second stage of level shifting unit are also done immediately to avoid a conversion time difference between a positive-phase signal and a negative-phase signal.

6. The level shifter of claim 1, wherein the input voltage signal received by the gate electrodes of the first transistor and the second transistor of the first stage of level shifting unit is boosted by the first stage of level shifting unit, the second stage of level shifting unit, and the third stage of level shifting unit in order to reach a voltage range of the first power domain to form the output voltage signal outputted by the first output terminal and the second output terminal of the third stage of level shifting unit.

7. The level shifter of claim 1, wherein the input voltage signal received by the gate electrodes of the first transistor and the second transistor of the first stage of level shifting unit is boosted by the first stage of level shifting unit, the second stage of level shifting unit, and the another third stage of level shifting unit in order to reach a voltage range of the second power domain to form the another output voltage signal outputted by the third output terminal and the fourth output terminal of the another third stage of level shifting unit.

8. The level shifter of claim 1, wherein a first signal conversion time at the first output terminal and the second output terminal of the third stage of level shifting unit of the first power domain is synchronous with a second signal conversion time at the third output terminal and the fourth output terminal of the another third stage of level shifting unit of the second power domain.

9. The level shifter of claim 1, wherein the first transistor, the second transistor, the third transistor, and the fourth transistor all have a first threshold voltage and a first breakdown voltage; the fifth transistor, the sixth transistor, the seventh transistor, and the eighth transistor all have a second threshold voltage and a second breakdown voltage; the first transistor, the second transistor, the third transistor, and the fourth transistor all have an operating voltage range between the ground voltage and (the second middle voltage minus the first threshold voltage) and voltages crossing the first transistor, the second transistor, the third transistor, and the fourth transistor are all smaller than the first breakdown voltage; the fifth transistor, the sixth transistor, the seventh transistor, and the eighth transistor all have an operating voltage range between (the second middle voltage plus the second threshold voltage) and the first middle voltage and voltages crossing the fifth transistor, the sixth transistor, the seventh transistor, and the eighth transistor are all smaller than the second breakdown voltage; the first breakdown voltage and the second breakdown voltage are both larger than 0.

10. The level shifter of claim 1, wherein the third stage of level shifting unit of the first power domain and the another third stage of level shifting unit of the second power domain both receive the same voltage signal boosted by the first stage of level shifting unit and the second stage of level shifting unit from the fifth node between the ninth transistor and the eleventh transistor of the second stage of level shifting unit and the sixth node between the tenth transistor and the twelfth transistor of the second stage of level shifting unit.

* * * * *